United States Patent [19]
Noda

[11] Patent Number: 5,512,779
[45] Date of Patent: Apr. 30, 1996

[54] SEMICONDUCTOR MEMORY DEVICE HAVING SILICON NITRIDE OVERLYING ONLY PERIPHERAL CIRCUIT AREAS

[75] Inventor: Masanori Noda, Kanagawa, Japan

[73] Assignee: Sony Corporation, Tokyo, Japan

[21] Appl. No.: 265,612

[22] Filed: Jun. 24, 1994

Related U.S. Application Data

[63] Continuation of Ser. No. 960,880, Oct. 14, 1992, abandoned.

[30] Foreign Application Priority Data

Oct. 29, 1991 [JP] Japan ................................. 3-309667

[51] Int. Cl.⁶ .................................................. H01L 23/58
[52] U.S. Cl. .......................... 257/640; 257/641; 257/649; 257/306
[58] Field of Search ...................... 257/640, 641, 257/649, 298, 370, 378, 306, 296, 297

[56] References Cited

U.S. PATENT DOCUMENTS

| | | | |
|---|---|---|---|
| 5,005,072 | 4/1991 | Gonzalez | 257/306 |
| 5,068,697 | 11/1991 | Noda et al. | 257/649 |
| 5,081,515 | 1/1992 | Murata et al. | 257/296 |
| 5,100,815 | 3/1992 | Tsubone et al. | 257/370 |

OTHER PUBLICATIONS

Smith, W. M. Jr. "Vertical One-Device Memory", IBM Technical Disclosure Bulletin, vol. 15 No. 12, May 1973.

*Primary Examiner*—Jerome Jackson, Jr.
*Assistant Examiner*—John Guay
*Attorney, Agent, or Firm*—Hill, Steadman & Simpson

[57] ABSTRACT

According to this invention, after a semiconductor nitride film is formed on the entire surface of a semiconductor memory device, the semiconductor nitride film on a memory cell portion is removed. After a semiconductor oxide-based film is formed as an interlayer insulator on the entire surface of the semiconductor memory device, the semiconductor oxide-based film on a peripheral circuit portion is removed using the semiconductor nitride film as a stopper. For this reason, a shallow contact hole is formed in the peripheral circuit portion, and highly reliable wiring can be obtained. In addition, since hydrogen can be supplied to a surface of a semiconductor substrate in the memory cell portion by hydrogen annealing, an interface state on the surface can be eliminated, and the data retention characteristics of the memory cells can be improved.

1 Claim, 3 Drawing Sheets

FIG. I

SEMICONDUCTOR MEMORY DEVICE HAVING SILICON NITRIDE OVERLYING ONLY PERIPHERAL CIRCUIT AREAS

This is a continuation of application Ser. No. 07/960,880, filed Oct. 14, 1992, now abandoned.

BACKGROUND OF THE INVENTION

1. Field of the Invention

The present invention relates to a semiconductor memory device having a memory cell portion and a peripheral circuit portion.

2. Description of the Prior Art

FIG. 1 shows a chip of a DRAM. Memory cell portions 11 indicated by the hatched portions in FIG. 1 and a peripheral circuit portion 12 arranged around the memory cell portions 11 are formed on the chip. An address decoder, a sense amplifier, and the like are formed in a region 13 of the peripheral circuit portion 12.

FIG. 2 shows an interface region 14 between the memory cell portion 11 and the peripheral circuit portion 12 in a conventional stacked capacitor DRAM. As shown in FIG. 2, an $SiO_2$ film 16 serving as a field oxide film is formed in an element isolation region including the interface region 14 on an Si substrate 15 of the chip, and a memory cell is constituted by a MOS transistor 17 and a capacitor 18 in the memory cell portion 11.

The MOS transistor 17 comprises a gate electrode, e.g., a word line constituted by a polycide film 21, source/drain regions constituted by diffusion layers 22 and 23, and a gate oxide film constituted by an $SiO_2$ film 24. The polycide film 21 and the like are covered with an interlayer insulator constituted by an $SiO_2$ film 25 and the like, and a contact hole 26 reaching the diffusion layer 22 is formed in the $SiO_2$ film 25.

The capacitor 18 comprises a storage node constituted by a polysilicon film 31 contacting the diffusion layer 22 through the contact hole 26, a capacitor insulating film constituted by an ONO film 32 or the like, and a plate electrode constituted by a polysilicon film 33. The polysilicon film 33 and the like are sequentially covered with an SiN film 34 having a thickness of several hundred Å and an interlayer insulator constituted by an $SiO_2$-based film 35 such as an $SiO_2$ film, a PSG film or the like.

A contact hole 36 reaching the polysilicon film 33 is formed in the $SiO_2$-based film 35 and the like, and a wiring constituted by a polycide film 37 is in contact with the polysilicon film 33 through the contact hole 36. The polycide film 37 and the like are covered with an interlayer insulator constituted by a BPSG film 41 or the like, and a contact hole 42 reaching the polycide film 37 is formed in the BPSG film 41.

A bit line constituted by a polycide film (not shown) is in contact with the diffusion layer 23. In the peripheral circuit portion 12, a contact hole 44 reaching a diffusion layer 43 is formed in the BPSG film 41 and the like.

Since the polycide films serving as the bit line or the like are generally of an n type, they can be brought into contact with only an n-type diffusion layer. For this reason, all the diffusion layers of the memory cell portion 11 including the diffusion layer 23 contacting the bit line are of an n type. However, since the peripheral circuit portion 12 also has a p-type diffusion layer, an Al wiring (not shown) must be formed.

This Al wiring is used as a shunt of the bit line, the word line, or the like in the memory cell portion 11, and it is in contact with the polycide film 37 or the like through the contact hole 42 or the like. Therefore, the Al wiring is not in contact with the diffusion layer 23 and the like in the memory cell portion 11. In contrast to this, the Al wiring is in contact with the diffusion layer 43 or the like through the contact hole 44 or the like in the peripheral circuit portion 12.

However, the Al wiring has poorer step coverage than that of a wiring constituted by a polysilicon film or the like. For this reason, in the peripheral circuit portion 12 wherein the Al wiring is set in contact with the diffusion layer 43 or the like, as shown in FIG. 2, an unnecessary $SiO_2$-based film 35 is selectively removed by etching to cause the contact hole 44 or the like to be shallow. At this time, the SiN film 34 is used as a stopper.

When an interface state is present in a region 45 due to a dangling bond on the interface between the $SiO_2$ film 24 and the Si substrate 15 in the region 45, the gate swing of the MOS transistor 17 is not steep so that a threshold voltage is increased. As a result, a write level of the capacitor 18 becomes low to decrease the storage charge amount of the capacitor 18, thereby degrading the data retention characteristics of the memory cell.

When an interface state is present in a region 46 due to a dangling bond on the interface between the $SiO_2$ film 16 and the Si substrate 15 in the region 46, the interface state serves as a generation/recombination center. Although a p-n junction is formed between the Si substrate 15 and the diffusion layer 22, a current leaks from the diffusion layer 22 to the Si substrate 15 through the interface state. Therefore, due to this phenomenon, the data retention characteristics of the memory cell are degraded.

For this reason, hydrogen annealing is performed to terminate the dangling bonds on the Si interfaces in the regions 45 and 46 by hydrogen and eliminate the interface states in the regions 45 and 46.

When annealing at a temperature of about 500° C. or more is performed after this hydrogen annealing is performed, bonds between Si and hydrogen are cut again. For this reason, the effect of the hydrogen annealing is decreased. Therefore, the hydrogen annealing is preferably performed after the annealing at the temperature of about 500° C. or more is finished and the contact holes 42 and 44 for Al wiring are formed as shown in FIG. 2, i.e., immediately before the Al wiring is formed. Note that sintering performed after the Al wiring is formed is performed without any problems because the sintering is performed at a temperature of about 400° to 450° C.

However, as is apparent from FIG. 2, the SiN film 34 is formed on the entire surface of the resultant structure in advance immediately before the Al wiring is formed. Since this SiN film 34 has a very high density, it does not allow permeation of even hydrogen. For this reason, even when the hydrogen annealing is performed, hydrogen cannot be supplied to the Si interfaces in the regions 45 and 46.

A conventional DRAM has a large number of contact holes for causing the Al wiring to contact the diffusion layer of an Si substrate, and the contact holes extend through an SiN film. For this reason, hydrogen can be diffused through the contact holes set in an open state.

However, in a recent DRAM, unlike the above conventional DRAM, since the Al wiring is not in contact with the diffusion layer 23 or the like in the memory cell portion to obtain a structure having a high integration level, the contact hole 42 or the like used for the Al wiring does not extend through the SiN film 34. For this reason, an interface state cannot be eliminated by the hydrogen annealing. As a result, the data retention characteristics of the memory cell are degraded in the prior art shown in FIG. 2.

SUMMARY OF THE INVENTION

According to the present invention, a semiconductor memory device having a memory cell portion and a peripheral circuit portion comprises a semiconductor oxide-based film covering only the memory cell portion, and a semiconductor nitride film covering only the peripheral circuit portion.

As described above, since the semiconductor nitride film is formed on the peripheral circuit portion, even when a semiconductor oxide-based film serving as an interlayer insulator is formed on the semiconductor nitride film, the semiconductor oxide-based film on the peripheral circuit portion can be selectively removed by etching using the semiconductor nitride film as a stopper.

In addition, since the peripheral circuit portion has no semiconductor oxide-based film, a shallow contact hole can be obtained in the peripheral circuit portion. On the other hand, the memory cell portion has no semiconductor nitride film, an interface state in the memory cell portion can be eliminated by hydrogen annealing.

Therefore, in the semiconductor memory device according to the present invention, since the shallow contact hole can be formed in the peripheral circuit portion, highly reliable wiring can be obtained. In addition, since the interface state in the memory cell portion can be eliminated by hydrogen annealing, a memory cell having excellent data retention characteristics can be obtained.

DETAILED DESCRIPTION OF THE PREFERRED EMBODIMENT

Figure 3:
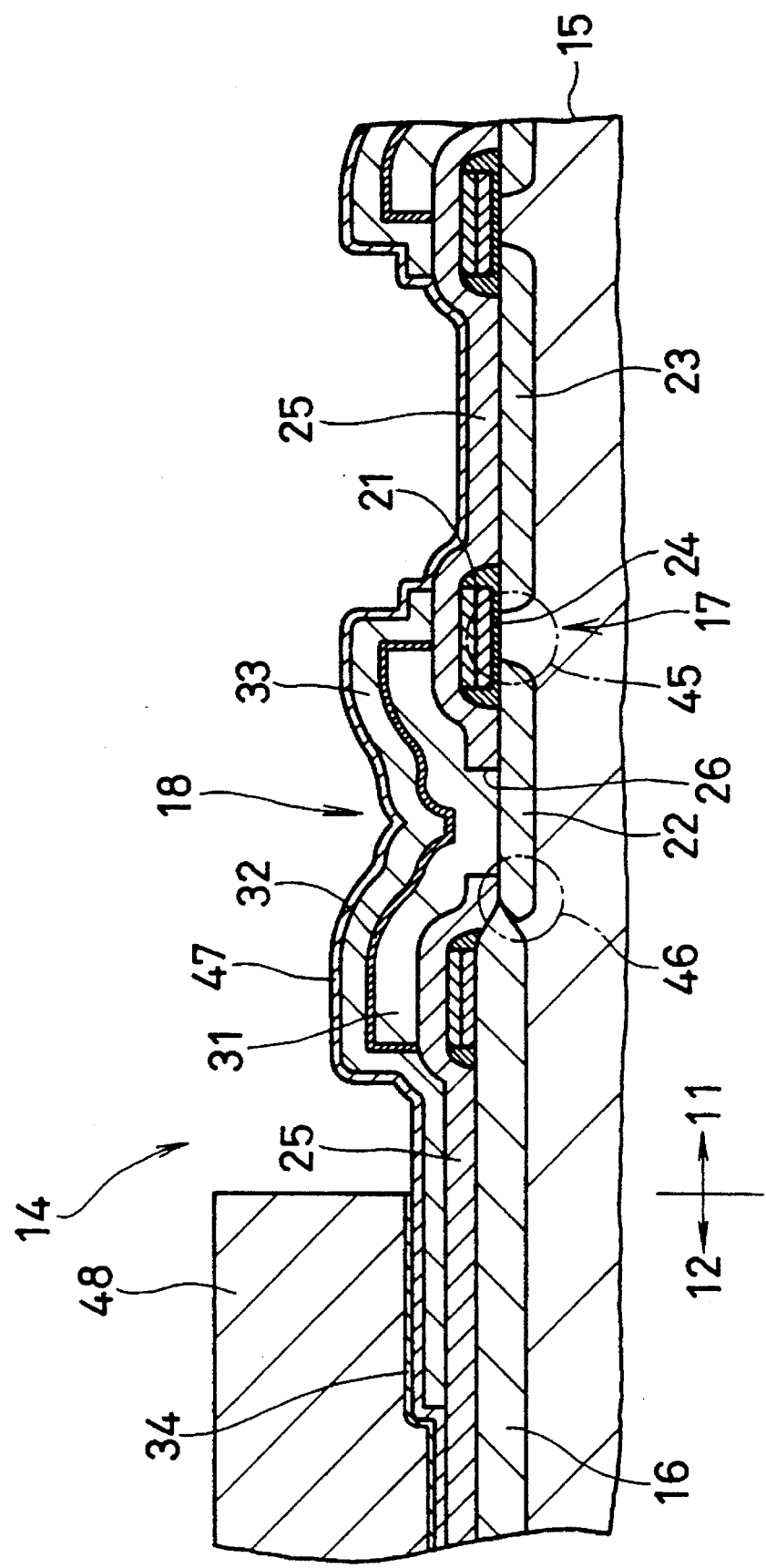
FIG. 3 is a side sectional view showing an embodiment of the present invention.

An embodiment in which the present invention is applied to a stacked capacitor DRAM will be described below with reference to FIG. 3.

In this embodiment, a polysilicon film 33 serving as the plate electrode of a capacitor 18 or the like is covered with a thin $SiO_2$ film 47, and an SiN film 34 is formed on the $SiO_2$ film 47 to cover only a peripheral circuit portion 12. Except for the above arrangement, the embodiment has the same arrangement as that of the prior art shown in FIG. 2.

Figure 1:
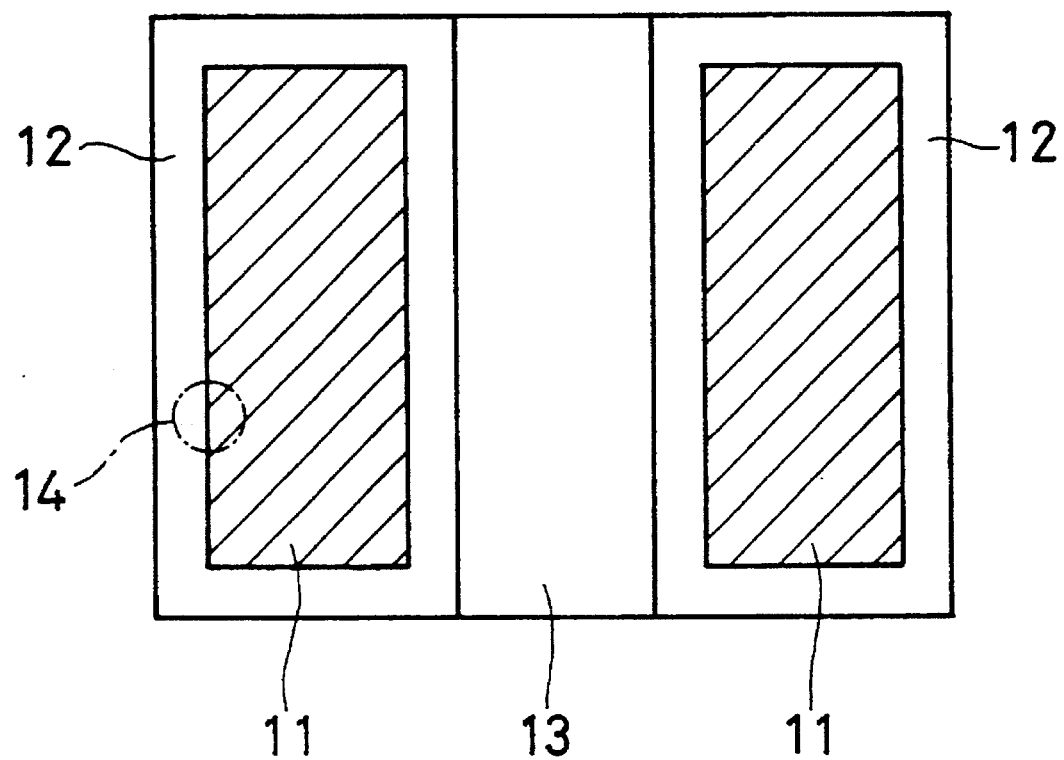
FIG. 1 is a plan view showing a chip of a DRAM.
Figure 2:
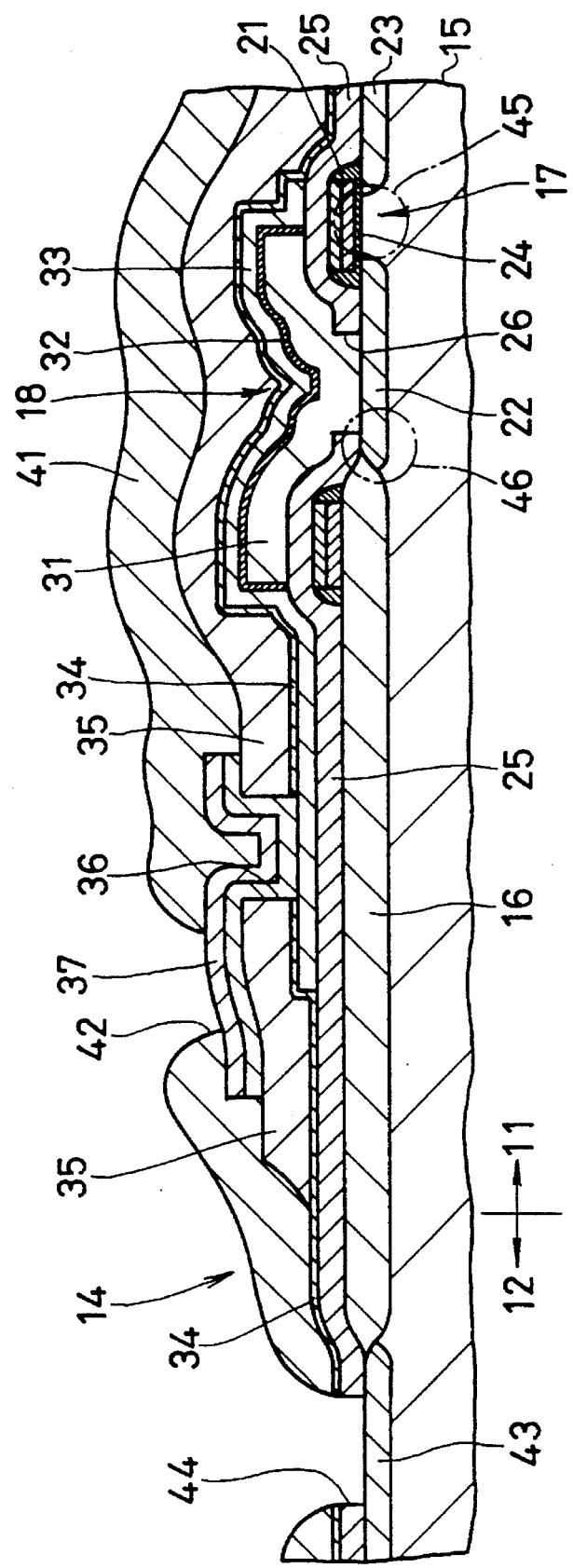
FIG. 2 is a side sectional view showing a prior art of the present invention.

In order to manufacture the DRAM of the embodiment, after the plate electrode is formed by the polysilicon film 33, the $SiO_2$ film 47 and the SiN film 34 are sequentially formed on the entire surface of the resultant structure. A resist mask 48 is patterned so as to cover only the peripheral circuit portion 12, and the SiN film 34 is etched using the resist mask 48 as a mask and using the $SiO_2$ film 47 as a stopper. Subsequently, the same steps as those of the steps in manufacturing the DRAM of the prior art shown in FIG. 2 are performed.

In the above-described embodiment, since the peripheral circuit portion 12 has the SiN film 34, even when an $SiO_2$-based film 35 is formed on the SiN film 34, the $SiO_2$-based film 35 on the peripheral circuit portion 12 can be selectively removed by etching using the SiN film 34 as a stopper. On the other hand, since the memory cell portion 11 has no SiN film 34, hydrogen can be doped to the Si interfaces in regions 45 and 46 by hydrogen annealing to eliminate interface states in the regions 45 and 46.

In the above embodiment, although the present invention is applied to a stacked capacitor DRAM, the present invention can be applied to semiconductor memory devices other than the stacked capacitor DRAM.

What is claimed is:

1. A semiconductor memory device comprising, source and drain regions formed in a substrate, a gate oxide insulator formed on said substrate between said source and drain, a gate electrode on said gate oxide insulator between said source and drain, a first polysilicon film on said source, an ONO film on said first polysilicon film, a second polysilicon film on said ONO film, another insulation film on said second polysilicon film, and a silicon nitride film on said another insulation film at regions which extend laterally from said ONO film and which is not over said source or said drain regions, and wherein said first and second polysilicon films form electrodes of a capacitor.

* * * * *